United States Patent
Sugawara

(10) Patent No.: US 7,544,970 B2
(45) Date of Patent: Jun. 9, 2009

(54) SEMICONDUCTOR DEVICE AND METHOD OF PRODUCING THE SAME, AND POWER CONVERSION APPARATUS INCORPORATING THIS SEMICONDUCTOR DEVICE

(75) Inventor: Yoshitaka Sugawara, Osaka (JP)

(73) Assignee: The Kansai Electric Power Co., Inc. (JP)

( * ) Notice: Subject to any disclaimer, the term of this patent is extended or adjusted under 35 U.S.C. 154(b) by 0 days.

(21) Appl. No.: 10/530,883

(22) PCT Filed: Aug. 19, 2004

(86) PCT No.: PCT/JP2004/011936

§ 371 (c)(1),
(2), (4) Date: Apr. 11, 2005

(87) PCT Pub. No.: WO2005/020320

PCT Pub. Date: Mar. 3, 2005

(65) Prior Publication Data
US 2005/0285228 A1 Dec. 29, 2005

(30) Foreign Application Priority Data
Aug. 22, 2003 (JP) ............................. 2003-299219

(51) Int. Cl.
*H01L 27/082* (2006.01)
(52) U.S. Cl. ..................... 257/77; 257/147; 257/584; 257/E29.104; 257/E29.212
(58) Field of Classification Search ......... 257/170–171, 257/147, 584, 77
See application file for complete search history.

(56) References Cited

U.S. PATENT DOCUMENTS

| 6,252,250 B1 * | 6/2001 | Harris et al. .................. 257/77 |
| 6,841,866 B2 | 1/2005 | Arai et al. |
| 6,849,874 B2 | 2/2005 | Sumakeris et al. |
| 2001/0024462 A1 | 9/2001 | Nakahara et al. |
| 2002/0134992 A1 * | 9/2002 | Shah .......................... 257/115 |
| 2003/0080842 A1 * | 5/2003 | Sumakeris et al. ............ 336/77 |
| 2003/0213979 A1 * | 11/2003 | Nakajima et al. ........... 257/200 |
| 2005/0184296 A1 * | 8/2005 | Sudarshan et al. ............ 257/77 |

FOREIGN PATENT DOCUMENTS

JP 07-131016 5/1995

(Continued)

OTHER PUBLICATIONS

Ivanov et al., "Recent develpoments in SiC single-crystal elelctronics," Semiconductor Sci. Technol. 7 (1992).*

(Continued)

*Primary Examiner*—Ahmed Sefer
(74) *Attorney, Agent, or Firm*—Sheridan Ross PC

(57) ABSTRACT

The temperature of a bipolar semiconductor element using a wide-gap semiconductor is raised using heating means, such as a heater, to obtain a power semiconductor device being large in controllable current and low in loss. The temperature is set at a temperature higher than the temperature at which the decrement of the steady loss of the wide-gap bipolar semiconductor element corresponding to the decrement of the built-in voltage lowering depending on the temperature rising of the wide-gap bipolar semiconductor element is larger than the increment of the steady loss corresponding to the increment of the ON resistance increasing depending on the temperature rising.

9 Claims, 7 Drawing Sheets

FOREIGN PATENT DOCUMENTS

| JP | 08-018030 | | 1/1996 |
|---|---|---|---|
| JP | 9-148681 | * | 6/1997 |
| JP | 09-148681 | | 6/1997 |
| JP | 10-022495 | | 1/1998 |
| JP | 2000-164967 | | 6/2000 |
| JP | 2001-094200 | | 4/2001 |
| JP | 2001-217363 | | 8/2001 |
| JP | 2001-325427 | | 11/2002 |
| JP | 2002-325355 | | 11/2002 |
| JP | 2004-161863 | | 6/2004 |

OTHER PUBLICATIONS

Danielsson et al., "Investigation of thermal prperties in fabricated 4H-SiC high power bipolar transistors," Science Direct (Jan. 2003).*

"4H-SiC High Power SIJFET Module" by Sugawara et al., ISPSD 2003, Apr. 14-17, Cambridge, UK, pp. 127-130.

"Structure of Stacking Faults Formed Durig the Forward Bias of 4H-SiC p-i-n Diodes" by Twigg et al., Applied Physics Letters, vol. 82, No. 15, Apr. 14, 2003, pp. 2410-2412.

"Recent Progress in SiC Power Device Developments and Application Studies" by Sugawara, ISPSD, Apr. 14-17, 2003, Cambridge, UK., pp. 10-18.

"4H-SiC p-n Diodes and Gate Turnoff Thyristors for High-Power, High-Temperature Applications" by Agarwal et al., Pergamon, Solid State Electronics 44 (2000), pp. 303-308.

Official Action (Restriction Requirement) for U.S. Appl. No. 11/421,400, mailed Aug. 14, 2007, pp. 1-5.

Stahlbush, Fedison, Arthur, Rowland, Kretchmer and Wang, "Propagation of Current-Induced Stacking Faults and Forward Voltage Degradation in 4H-SiC PiN Diodes", Materials Science Forum, vol. 389-393 pp. 427-430, 2002 Trans Tech Publications, Switzerland.

Official Action for U.S. Appl. No. 11/407,561, mailed Mar. 18, 2008, pp. 1-14.

Official Action for U.S. Appl. No. 11/421,400, mailed Nov. 29, 2007, pp. 1-10.

Notice of Allowance for U.S. Appl. No. 11/855,138, mailed Jun. 2, 2008, pp. 1-9.

Notice of Allowance for U.S. Appl. No. 11/421,400, mailed Jul. 16, 2008, pp. 1-6.

Notice of Allowance for U.S. Appl. No. 11/407,561, mailed Oct. 9, 2008, pp. 1-4.

Ryu et al., "3100 V, Asymmetrical, Gate Turn-Off (GTO) Thyristors in 4H-SiC", IEEE Electron Device Letters, vol. 22, No. 3, Mar. 2001, pp. 127-129.

Rahimo et al., "Extending the Boundary Limits of High Voltage IGBTs and Diodes to above 8kV", Proceedings of the 14th International Symposium on Power Semicondcutor Devices & ICs 2002, pp. 41-44.

* cited by examiner

SEMICONDUCTOR DEVICE AND METHOD OF PRODUCING THE SAME, AND POWER CONVERSION APPARATUS INCORPORATING THIS SEMICONDUCTOR DEVICE

TECHNICAL FIELD

The present invention relates to a power semiconductor device being large in controllable current (permissible maximum current in ON/OFF control under electrifying state), and a power conversion apparatus incorporating this power semiconductor device.

BACKGROUND ART

A power semiconductor device for use in a power apparatus dealing with a high voltage and a large current is required to be low in power loss, large in controllable current and high in reliability. As conventional power semiconductor devices being large in controllable current and large in power capacity, an insulated gate bipolar transistor (IGBT) and a self-excited thyristor made of silicon (Si) are available. The self-excited thyristor is a thyristor capable of carrying out on/off control according to a gate control signal, and a gate turn off thyristor (GTO thyristor), a static induction thyristor, a MOS thyristor, etc. are known. In addition, as other power semiconductor devices, diodes having a pn-junction, such as a pn-junction diode, an MPS (Merged pin/Schottky) diode and an SRD (Soft and Recovery Diode), are known.

In recent years, wide-gap semiconductor materials, such as silicon carbide (SiC), are attracting attention as semiconductor materials to substitute for Si. In comparison with Si, SiC has excellent physical characteristics, being remarkably high in dielectric breakdown field strength, operable at a high temperature of 150° C. or more and large in energy gap. The development of power semiconductor devices using SiC as a material suited for power semiconductor devices which are low in loss and high in withstand voltage is carried out. As a self-excited thyristor made of a wide-gap semiconductor material, a SiC-GTO thyristor has been disclosed in 2001 IEEE ELECTRON DEVICE LETTERS, Vol. 22, No. 3, pages 127 to 129. In the SiC-GTO thyristor, the gate control signal only selects either current flowing (ON) or current shutoff (OFF) but does not control the value of the current, therefore a controllable current is larger than that of the IGBT. The switching speed of the SiC-GTO thyristor is very high, having a level equivalent to that of the Si IGBT, therefore its switching loss is as small as that of the Si IGBT.

Nonpatent literature 1: 2001 IEEE ELECTRON DEVICE LETTERS, Vol. 22, No. 3, pages 127 to 129.

Nonpatent literature 2: Proceedings of the 14th International Symposium on Power Semiconductor Devices & ICs 2002, pages 41 to 44

DISCLOSURE OF THE INVENTION

Problem to be Solved by the Invention

In transistors such as an IGBT, the current to be passed changes according to the level of the gate control signal, and the value of the current to be passed is restricted according to the level of the gate control signal. However, since the current to be passed becomes saturated eventually, the controllable current is small. In a thyristor, for example, after it is turned on once, since the current to be passed is not restricted according to the gate control signal, the controllable current can be made large. The fact that the gate control signal only selects either current flowing or current shutoff but cannot control the value of the current is hereinafter referred to as "the current to be passed is not restricted according to the gate control signal." The fact that "the current to be passed is restricted according to the gate control signal" means that the gate control signal can control the value of the current.

The power loss of a transistor such as an IGBT is smaller than that of a thyristor. Generally speaking, the total power loss (hereinafter referred to as total loss) of a semiconductor device is represented by the following expression (1).

Total loss=(steady loss)+(switching loss)={(built-in voltage)+(ON resistance)×(current to be passed)}×(current to be passed)+(switching loss)　　(1)

The ON resistance of a Si IGBT is slightly larger than that of a Si self-excited thyristor. Hence, its steady loss is slightly large. However, since its switching speed is very high, its switching loss is very small; as a result, its total loss is small. The ON resistance of a wide-gap bipolar semiconductor device made of SiC or the like is smaller than that of a Si bipolar semiconductor device. However, the energy gap of SiC is larger than that of Si. Hence, the built-in voltage of a SiC semiconductor device is far larger than the built-in voltage of a Si semiconductor device by 2.2 to 6.1 times. Hence, the steady loss of the SiC semiconductor device becomes very large, and its total loss becomes larger than that of the Si semiconductor device. As described above, it is difficult to realize a SiC power semiconductor device being low in loss and large in controllable current using conventional technologies.

The present invention purposes to provide a semiconductor device being low in loss, large in controllable current and high in reliability, a method of producing the semiconductor device, and a power conversion apparatus.

Means for Solving Problem

A semiconductor device in accordance with the present invention comprises a wide-gap bipolar semiconductor element using wide-gap semiconductors and having a built-in voltage in a forward characteristic, and a semiconductor package accommodating the above-mentioned wide-gap bipolar semiconductor element and having electrical connection means for connecting the above-mentioned wide-gap bipolar semiconductor element to external apparatuses. The above-mentioned semiconductor package has heating means for keeping the above-mentioned wide-gap bipolar semiconductor element at a predetermined temperature higher than ordinary temperature. In the following descriptions, the simply stated word "temperature" means the junction temperature of a semiconductor device at all times, unless otherwise specified.

A semiconductor device in accordance with the present invention comprises a wide-gap bipolar light-emitting semiconductor element using wide-gap semiconductors, and a wide-gap photodiode provided so as to be opposed to the above-mentioned wide-gap bipolar light-emitting semiconductor element and to receive light emitted from said wide-gap bipolar light-emitting semiconductor element. The above-mentioned wide-gap bipolar light-emitting semiconductor element and wide-gap photodiode are accommodated in a package having electrical connection means for connecting the above-mentioned wide-gap bipolar light-emitting semiconductor element and wide-gap photodiode to external apparatuses. The above-mentioned package has heating means for keeping the above-mentioned package at a predetermined temperature higher than ordinary temperature.

A semiconductor device production method in accordance with the present invention comprises a step of forming a second conductive type SiC drift layer having low impurity concentration on a first conductive type SiC cathode region having high impurity concentration, and a step of forming a first conductive type SiC base region on the above-mentioned drift layer. The above-mentioned production method further comprises a step of forming a second conductive type SiC anode region on the above-mentioned base region, and a step of irradiation of an electron beam having predetermined irradiation energy to the above-mentioned cathode region, drift region, base region and anode region at a predetermined electron density.

A semiconductor device production method in accordance with the present invention comprises a step of forming a first conductive type SiC drift layer having low impurity concentration on a first conductive type SiC cathode region having high impurity concentration, and a step of forming a second conductive type SiC anode region on the above-mentioned drift layer. The above-mentioned production method further comprises a step of forming an anode electrode on the above-mentioned anode region, a step of forming a cathode electrode on the above-mentioned cathode region, and a step of generating stacking faults in the above-mentioned drift layer and anode region by passing a predetermined forward current for a predetermined time between the above-mentioned anode electrode and cathode electrode.

A power conversion apparatus in accordance with the present invention comprises a GTO thyristor element using wide-gap semiconductors, and a diode element using wide-gap semiconductors and connected in reverse parallel to the above-mentioned GTO thyristor element. The above-mentioned GTO thyristor element and the above-mentioned diode element are accommodated in a package having electrical connection means for connecting the above-mentioned GTO thyristor element and the above-mentioned diode element in reverse parallel and for connecting the above-mentioned GTO thyristor element and the above-mentioned diode element having been connected in reverse parallel to external apparatuses. The above-mentioned package is provided with a switching circuit in which three series connections, each comprising at least two switching modules connected in series and each switching module having heating means for keeping the above-mentioned GTO thyristor element and diode element at a predetermined temperature higher than ordinary temperature, are connected in parallel between the positive electrode and the negative electrode of a DC power source. Each of the above-mentioned switching modules is provided with a control circuit that controls the operation of the above-mentioned switching circuit after each switching module is heated using the above-mentioned heating means and the temperature of each switching module reaches a predetermined temperature.

The wide-gap bipolar semiconductor device in accordance with the present invention will be described below. The fact that the gate control signal only selects either current flowing or current shutoff but does not control the value of the current is hereinafter referred to as "the current to be passed is not restricted according to the gate control signal." The fact that "the current to be passed is restricted according to the gate control signal" means that the gate control signal can control the value of the current. In the following descriptions, the characteristics of the semiconductor device in accordance with the present invention will be described while being compared as necessary with those of Si semiconductor devices and the like based on conventional technologies.

First, a controllable current will be described. In the wide-gap bipolar semiconductor devices, such as a pn-junction diode and a self-excited thyristor in accordance with the present invention using wide-gap semiconductors, the current to be passed is not restricted according to the gate control signal. Hence, the controllable currents of these wide-gap bipolar semiconductor devices in accordance with the present invention are larger than those of bipolar semiconductor devices such as an IGBT or wide-gap semiconductor devices, in which the current to be passed is restricted according to the gate control signal. In particular, the controllable current of the wide-gap bipolar semiconductor device in accordance with the present invention is large even at a high temperature exceeding the operation limit junction temperature (approximately 125° C. to 150° C.) of a conventional Si bipolar semiconductor device.

Next, total loss will be described. Generally speaking, when the temperature of a semiconductor device rises, its built-in voltage lowers and its ON resistance increases. In a Si bipolar semiconductor device having a predetermined built-in voltage in the forward direction characteristic such as a conventional Si pn-junction diode and a conventional self-excited thyristor, when the temperature of the bipolar element is raised, its total loss increases. In the case of the conventional Si semiconductor device, when its temperature is raised, its built-in voltage decreases, but its ON resistance and carrier life-time increase significantly. Its steady loss increases significantly owing to this significant increase of the ON resistance. The increment of this steady loss is larger than the decrement of the steady loss owing to the decrease of the built-in voltage, whereby the total steady loss increases. Furthermore, since the switching time at the turn OFF significantly increases owing to the significant increase of the carrier life-time, the switching loss increases significantly. As a result, the total loss increases as obviously indicated by Expression (1).

The inventors have found the following facts as a result of various experiments.

The following two phenomena were found with respect to quantitative temperature dependency as a result of the comparison of respective temperature dependencies between a wide-gap bipolar semiconductor device and a Si bipolar semiconductor device having the same withstand voltage.

A first phenomenon is that in the case that the temperature of the wide-gap bipolar semiconductor device is raised, the decrement of the steady loss owing to the decrease of the built-in voltage is larger than the increment of the steady loss owing to the increase of the ON resistance in a practical current density range (for example, a current density of 1 A to 700 A/cm$^2$).

Generally speaking, the switching time at the turn OFF of a semiconductor device becomes longer as the temperature rises, and the switching loss increases.

A second phenomenon is that the increase of the switching time of the wide-gap bipolar semiconductor device owing to temperature rise is less than that of a bipolar semiconductor device such as a Si IGBT, and that the increase of the switching loss is thus small, provided that their withstand voltage values are the same.

The factor of the first phenomenon is as described below. The ON resistance of the wide-gap bipolar semiconductor device is significantly smaller than that of the Si bipolar semiconductor device at ordinary temperature. Hence, even if the ON resistance of the wide-gap bipolar semiconductor device is increased owing to temperature rise, its increment is small.

The factor of the second phenomenon is as described below. The carrier life-time of the wide-gap bipolar semiconductor device is significantly shorter than that of the Si bipolar semiconductor device. Hence, even if the carrier life-time of the wide-gap bipolar semiconductor device is increased owing to temperature rise, its increment is small.

The present invention uses the above-mentioned first and second phenomena and is characterized in that the wide-gap bipolar semiconductor device is operated while its temperature is kept at a temperature higher than ordinary temperature using a temperature raising means. In other words, the temperature of the element of the wide-gap bipolar semiconductor device, such as a pn-junction diode or a self-excited thyristor is raised using a temperature raising means. Hence, the decrease of the steady loss owing to the decrease of the built-in voltage can be made larger than the increase of the steady loss owing to the increase of the ON resistance. As a result, the total steady loss can be reduced. On the other hand, since the increment of the switching loss owing to temperature rise is relatively small, the total loss can be reduced.

In the wide-gap bipolar semiconductor device, since the quality of its crystal is not yet sufficiently good, there are numerous carrier traps of various kinds. Hence, in the wide-gap bipolar semiconductor device, its tail current at the turn-off is significantly larger than that of Si. As the temperature of the wide-gap bipolar semiconductor device becomes high, this tail current further increases, and the switching loss increases significantly. It is conceivable that this is caused by the release of numerous trapped carriers at the high temperature.

As a result of various experiments, the inventors have found a third phenomenon wherein this tail current can be reduced by irradiation of an electron beam or a charged particle beam to the wide-gap bipolar semiconductor device. This is conceivable that newly formed traps in the SiC semiconductor layer of the wide-gap bipolar semiconductor device by irradiating the electron beam or the charged particle beam become dominant over the existing traps, and that the carrier life-time is determined by these traps. However, excessive irradiation leads to increase in ON voltage and steady loss. As to electron beam irradiation conditions, the irradiation energy is selected in the range of 0.1 MeV to 20 MeV and the amount of irradiation is selected in the range of $5 \times 10^{11}/cm^2$ to $5 \times 10^{14}/cm^2$ of the number of electrons per unit area, for example and then annealing is carried out. The carrier life-time can be adjusted in the range of approximately 0.01 µs to 20 µs using electron beam irradiation on the above-mentioned irradiation conditions. Consequently, the tail current can be reduced without causing significant increase in ON voltage; as a result, the switching loss can be reduced significantly. The reduction effect of the switching loss owing to this electron beam irradiation is added to the reduction effect of the steady loss component owing to the decrease in built-in voltage obtained as the result of raising the temperature of the element by means of the temperature raising means as described above. Therefore, the total loss of the semiconductor device can be reduced while its controllability is maintained properly, and the purpose of the present invention can be accomplished effectively.

Furthermore, in the case of the wide-gap bipolar semiconductor device, even if its total loss is made smaller than that of the Si bipolar semiconductor device by raising the temperature of the semiconductor element, the energy gap of the wide-gap bipolar semiconductor device is not lower than the energy gap of Si, and a considerable margin is present. Hence, even if the temperature of the semiconductor element is raised to the extent described above, thermal runaway or thermal destruction hardly occurs, therefore high reliability with respect to temperature can be ensured. Still further, for the purpose of obtaining a high withstand voltage, the electric field in the field relaxation region can be lowered by setting the width of the field relaxation region at a value larger than its theoretical limit value. Even in this case, the increment of the ON resistance owing to the increase of the width of the field relaxation region is smaller than that of the Si bipolar semiconductor element, because the ON resistance of the wide-gap bipolar semiconductor element is significantly low. In other words, high reliability can be ensured without impairing the low loss characteristic. As mentioned above, the present invention can realize a semiconductor device being low in loss, large in controllable current and high in reliability.

According to the temperature dependency of the ON voltage of the wide-gap bipolar semiconductor element, the ON voltage is high at a low temperature and gradually lowers as the temperature becomes higher. However, there is a tendency that the ON voltage becomes the lowest at a certain upper limit temperature (in the case of SiC, it is determined depending on the element structure in the range of 350 to 600° C.) and becomes high reversely at a temperature higher than the above-mentioned upper limit temperature. This means that the temperature dependency of the steady loss of the element also has a similar tendency. Therefore, it is not desirable that the temperature of the semiconductor element is raised to the above-mentioned upper limit temperature or more. This upper limit temperature depends on the density of the current to be passed and lowers as the current density is high. For example, in the case of the SiC bipolar semiconductor device, the temperature is approximately 300° C. at the current density of 700 A/cm$^2$ and approximately 750° C. at the current density of 5 A/cm$^2$. For the purpose of effectively attaining the object of the present invention for increasing the controllable current, the SiC bipolar semiconductor device is used at a value of the current density higher than the current density (25 to 40 A/cm$^2$) corresponding to the rated current of a Si bipolar semiconductor element having the same rating. The upper limit temperature of the SiC bipolar semiconductor device at the high current density is approximately 600° C. The desirable temperature range for driving the SiC bipolar semiconductor device is higher than ordinary temperature and not more than the above-mentioned upper limit temperature. This temperature range is hereinafter referred to as a "proper temperature range." The proper temperature range is, for example, 200° C. to 400° C. In order to operate the SiC bipolar semiconductor device within this proper temperature range, it may be possible that operation is started at room temperature and then the temperature of the SiC bipolar semiconductor device is raised to the proper temperature range by self-heating owing to its steady loss. However, for the purpose of promptly stabilizing the temperature, it is preferable that the operation of the SiC bipolar semiconductor device is started after heated in advance so that its temperature is in the above-mentioned proper temperature range. In other words, in the case that a load is driven using a predetermined constant power source formed of a power conversion apparatus comprising wide-gap semiconductor elements, the elements are heated to a high temperature by a heating means and then started so as to be driven. With this method, not only the steady loss can be made small but also the load can be brought to steady operation promptly, whereby the reliability of the power conversion apparatus is improved.

The wide-gap bipolar semiconductor element has a peculiar crystal defect depending on crystal face orientation, and this crystal defect may impair the reliability of the element. For example, in a pn diode as a typical wide-gap bipolar semiconductor element of a four-layer hexagonal shape Sic, an n-type semiconductor region is formed by epitaxial growth on a crystal face inclined 3 to 8 degrees with respect to the (0001) crystal face so that a single crystal can be obtained easily. Next, a p-type semiconductor region is formed on this n-type semiconductor region by epitaxial growth or ion implantation. When the above-mentioned n-type and p-type semiconductor regions are formed, a crystal defect referred to as basal plane dislocation occurs in both the semiconductor regions. It is known that when a pn diode having the basal plane dislocation is electrified, the basal plane dislocation forms "stacking faults, each of which denoted by a reference sign 1×." It is considered that the stacking faults are formed by the impact energy generated when minority carriers implanted, for example, from the ptype semiconductor region to the n-type semiconductor region collide with the lattice point of a crystal. The quantity of the stacking faults formed by energization is greater as the current to be passed II for the energization is larger. The stacking faults trap, recombine and vanish implanted minority carriers, whereby the life-time of the minority carriers is shortened. The increase of the stacking faults shows a degradation phenomenon of the semiconductor region; as a result, the ON voltage becomes high. The high ON voltage results in the increase of the power loss during the energization, and there is a danger that the pn diode element may be destroyed by heat in some cases.

As a result of various experiments, the inventors have found that when the temperature of the pn diode element is raised, the minority carrier trapping action owing to the above-mentioned stacking faults decreases and that the vanishing of minority carriers owing to the recombination can be prevented. Even if the stacking faults increase, the phenomenon rising the ON voltage can be suppressed by maintaining a high temperature of the pn diode element. More specifically, the minority carrier trapping action begins to decrease in the state that the temperature of the pn diode element is 50° C. or more, and it almost disappears at 250° C. or more, and the phenomenon wherein the ON voltage becomes high occurs very rarely. As a result, the increase in power loss can be prevented, and high reliability can be attained.

The stacking faults formed once are not vanished even if the temperature of the element is lowered; hence, if energization is carried out when the temperature of the element is low, a large power loss occurs owing to the action of the stacking faults, and there is a danger that the element may be destroyed. Hence, the temperature of the element is raised in advance to 125° C. or more before energization. When energization is started at this temperature, the temperature of the element rises abruptly and reaches 250° C. or more in a short time owing to self-heating. Therefore, even if stacking faults are present, the influence thereof can be avoided, and the element can be energized while the ON voltage does not become high.

As a means for raising the temperature of the wide-gap bipolar semiconductor element, a heating means is provided to heat the wide-gap bipolar semiconductor element. In addition, as another means for raising the temperature of the wide-gap bipolar semiconductor element, the self-heating generated at the time when part or whole of the components of the wide-gap bipolar semiconductor element is energized may also be used to raise the temperature. Both the heating using the heating means and the self-heating may also be used together. When the self-heating is used, the temperature of the wide-gap bipolar semiconductor element can be raised to a desired value by properly setting the size, material and shape of a heat sink provided on the wide-gap bipolar semiconductor element. When the heat sink is made small and employs a material having a specific heat, the rising speed of the temperature of the wide-gap bipolar semiconductor element can be increased, and the temperature can be raised high. Furthermore, an air cooling fan may also be provided as necessary. The temperature of the wide-gap bipolar semiconductor element can be set at a desired value by adjusting the rotation speed of the fan. In the case that the self-heating is utilized, no heating means is required, whereby the configuration of the wide-gap bipolar semiconductor element is simplified.

EFFECT OF THE INVENTION

In the semiconductor device in accordance with the present invention, the wide-gap bipolar semiconductor element having a built-in voltage in forward direction characteristic and for controlling current flowing and shutoff according to a control signal is started to operate after it is raised to a predetermined temperature in advance. Hence, it is possible to realize a semiconductor device being large in controllable current, low in loss and high in reliability.

Figure 1:
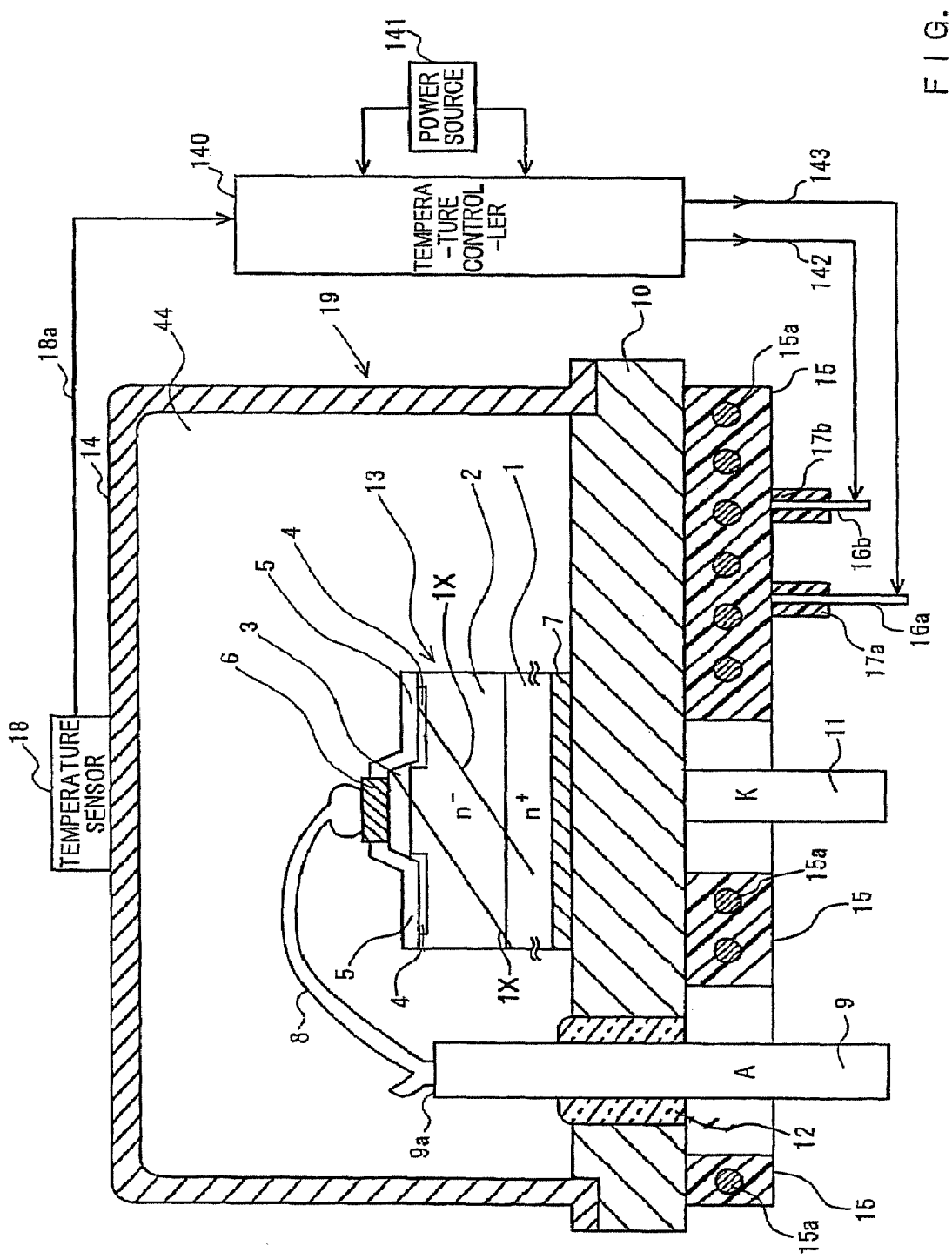
FIG. 1 is a cross-sectional view of a wide-gap pn diode device in accordance with a first embodiment of the present invention.

EXPLANATIONS OF NUMERALS 1 cathode region
2 drift layer
3 anode region
4 field relaxation region
5 surface protection film
6 anode electrode
7 cathode electrode
8 lead wire
9, 11 lead pin
10, 38, 67, 125 support
12 insulating glass
13 pn diode element
14 metal cap
15, 46, 85, 127 heater
18 temperature sensor
21 cathode region
22 buffer region 24 base region
25 anode region
27 surface protection film
28 anode electrode
31 gate electrode
32 cathode electrode
42 synthetic polymer compound
51 GaN-GTO thyristor
52 SiC photodiode
53 cathode region
54 gate region
55 anode region
57 surface protection film
60 light emission window
80 light-receiving portion
88 heat sink
90 inverter apparatus
98 fan
100a, 100b switching module

BEST MODES FOR CARRYING OUT THE INVENTION

Preferred embodiments in accordance with the present invention will be described below referring to FIG. 1 to FIG. 7. In each figure, the dimensions of each component shown in the figure do not correspond to its actual dimensions so that the figure can be understood easily. In the following descriptions, the simply stated word "temperature" means the junction temperature of a semiconductor device at all times, unless otherwise specified.

First Embodiment

A semiconductor device in accordance with a first embodiment of the present invention is a SiC (silicon carbide) pn diode device 19 having a withstand voltage of 8.5 kV and will be described below referring to FIG. 1.

FIG. 1 is a cross-sectional view of the SiC-pn diode device 19 in accordance with the first embodiment of the present invention. In FIG. 1, a SiC pn diode element 13 is an element of a four-layer hexagonal shape, and an n-type SiC drift layer 2 having low impurity concentration and a thickness of approximately 95 μm is formed on an n-type SiC cathode region 1 having high impurity concentration and a thickness of approximately 300 μm. On the lower face of the cathode region 1, a cathode metal electrode 7 is formed. A p-type SiC anode region 3 constituting the main junction to the drift layer 2 is formed in the central region of the drift layer 2. Around the anode region 3, a p-type SiC field relaxation region 4 is formed. An anode metal electrode 6 is formed on the anode region 3. A surface protection film 5 is formed on the surface of the element, excluding the anode metal electrode 6.

The anode metal electrode 6 is connected to the connection end 9a of a lead pin 9 made of metal and serving as an electrical connection means via a lead wire 8 made of gold. The cathode metal electrode 7 is bonded to the upper face of a support 10 made of metal so as to maintain electrical connection. A lead pin 11 made of metal and serving as an electrical connection means is connected at the central portion of the lower face of the support 10. This SiC-pn diode device 19 is connected to external wires via the lead pins 9 and 11. The lead pin 9 passes through the support 10, and the pass-through portion thereof is tightly sealed and firmly fixed with high melting point insulating glass 12. The upper face of the support 10, including the pn diode element 13 and the connection end 9a of the lead pin 9, is covered with a cap 14 made of metal, and the space 44 in the interior thereof is filled with nitrogen gas.

On the lower face of the support 10, a sheet-shaped heater 15 comprising a nichrome wire 15a embedded inside a sheet made of heat-resistant rubber, such as silicone rubber, is installed as a heating means for raising the temperature of the pn diode element 13. The heater 15 has terminals 16a and 16b covered with insulators 17a and 17b, respectively, so that a current is passed through the nichrome wire 15a disposed inside.

An example of a method of producing the SiC-pn diode device 19 in accordance with this embodiment will be described in detail. The cathode metal electrode 7 of the SiC-pn diode element 13 is soldered to the support 10 using gold-silicon high-temperature solder. The lead wire 8 of gold connects between the anode electrode 6 and the end 9a of the lead pin 9 of metal using a lead bonding apparatus. In FIG. 1, the lead wire 8, only one in number, is shown; however, in an actual element, a multiplicity of the lead wires 8 are connected in parallel depending on the value of the current flowing therethrough. The metal cap 14 is attached on the support 10 configured above in the atmosphere of nitrogen gas, and the periphery thereof is welded and tightly sealed to form a package. Hence, the space 44 inside the cap 14 is filled with nitrogen gas. In the end, the heater 15 is bonded to the lower face of the support 10, and a temperature sensor 18 is installed on the outer face of the cap 14, whereby the SiC-pn diode device 19 is completed. The connection wire 18a of the temperature sensor 18 is connected to a temperature controller 140. On the basis of the detection output of the temperature sensor 18, the temperature controller 140 supplies the electric power of a power source 141 to the heater 15 via connection wires 142 and 143 and the terminals 16a and 16b of the heater 15 and controls the temperature of the pn diode element 13 to a predetermined value.

An example of the operation of the SiC-pn diode device 19 in accordance with this embodiment will be described below. Before the pn diode device 19 is operated, the heater 15 is energized to heat the support 10, and the temperature of the pn diode element 13 is kept at approximately 250° C. The detection of the temperature of the pn diode element 13 is carried out by the following method in which a characteristic wherein the ON voltage thereof rises corresponding to the temperature rise of the element is utilized. The SiC-pn diode device 19 provided with the cap 14 to form a package is put into a temperature-variable heating chamber, and the temperature of the heating chamber is raised gradually from room temperature. A forward pulse current, approximately two hundredths of the rated current, with a time width of 200 μs for example is passed through the pn diode element 13 during heating. When the above-mentioned pulse current is passed, the temperature of the pn diode element 13, nearly equal to the temperature of the heating chamber, and the ON voltage thereof are measured, and a calibration curve (graph) representing the relationship between the two is drawn. The temperature is then measured using this graph. In other words, the above-mentioned pulse current is applied to the pn diode element 13 during heating, and the ON voltage is measured. The temperature of the pn diode element 13 can be known by referring to the above-mentioned graph on the basis of the measured value of the ON voltage. After the temperature of the pn diode element 13 reaches a predetermined value, 250° C. for example, the application of the pulse current is stopped, the energization of the heater 15 is controlled by the temperature controller 140 referring to the detection value of the temperature sensor 18 to keep the temperature of the pn diode element 13 at the above-mentioned predetermined value.

Next, a reverse voltage is applied across the lead pins 9 and 11 so that the potential at the lead pin 11 is higher than that of the lead pin 9, and the withstand voltage is measured. The withstand voltage of the pn diode device 19 in accordance with this embodiment is 8.5 kV. The leak current density at a reverse voltage of 8.5 kV was $2\times10^{-3}$ A/cm$^2$ or less, and a desired characteristic was obtained at a high temperature of 250° C. The controllable current was 200 A, and the energization of a current of 200 A was possible at a cyclic frequency of 5 kHz and a high current density of 360 A/cm$^2$. The ON voltage was 2.5 V, the reverse recovery charge was 11 µC, the steady loss was approximately 280 W, and the switching loss was approximately 33 W when the energization was carried out at a high current density of 360 A/cm$^2$. At this time, the junction temperature of the pn diode element 13 became approximately 340° C. in a short time of 3 seconds or less.

In the case of a conventional Si-pn diode having a withstand voltage of 8.5 kV, as disclosed in the following literature "Proceedings of the 14th International Symposium on Power Semiconductor Devices & ICs 2002, pages 41 to 44," the ON voltage was 3.5 V and the reverse recovery charge was approximately 125 µC at the time when a current of 150 A (having a current density of approximately 50 A/cm$^2$) was passed through at a junction temperature of 125° C. The steady loss of the SiC-pn diode device 19 in the present embodiment is approximately 95% in comparison with the above-mentioned conventional Si-pn diode. Furthermore, since the reverse recovery charge of the pn diode device in accordance with this embodiment is smaller by approximately one order of magnitude, the switching loss thereof also becomes smaller by approximately one order of magnitude. The total loss of the SiC-pn diode device 19 can be reduced significantly to approximately 50% of that of the Si-pn diode. The ON resistance of the SiC-pn diode device 19 at a junction temperature of 340° C. is far smaller than the ON resistance of the Si-pn diode at a junction temperature of 125° C.; as a result, the total loss becomes small. In the SiC semiconductor at a temperature of 340° C., an energy gap of approximately 1.66 eV remains until it loses the property of a semiconductor, as it were, until it becomes the state of metal. Since this energy gap of 1.66 eV is larger than the energy gap of 1.1 eV of Si, at a temperature of 125° C., high reliability with respect to temperature can be ensured.

The thickness of the n-type drift layer 2 of the pn diode element 13 in accordance with this embodiment is approximately 95 µm. Since the thickness of the depletion layer at the time when a reverse voltage of 8.5 kV is applied to the pn diode element 13 is approximately 85 µm, a margin of approximately 10 µm is provided. Since the pn diode element 13 in accordance with this embodiment has this margin in thickness, high reliability with respect to withstand voltage can be ensured.

Since operation is carried out after the temperature of the pn diode element 13 is raised to a high temperature of approximately 250° C. in advance by the heater 15, the influence of stacking faults affecting the increase of the ON voltage is reduced extremely, whereby the ON voltage can be prevented from rising during operation. Hence, the loss caused in the pn diode element 13 can be maintained at a constant value; also in this point, high reliability can be ensured.

As mentioned above, according to the present embodiment, the SiC-pn diode device 19 being low in power loss, large in controllable current and high in reliability can be realized.

Second Embodiment

Figure 2:
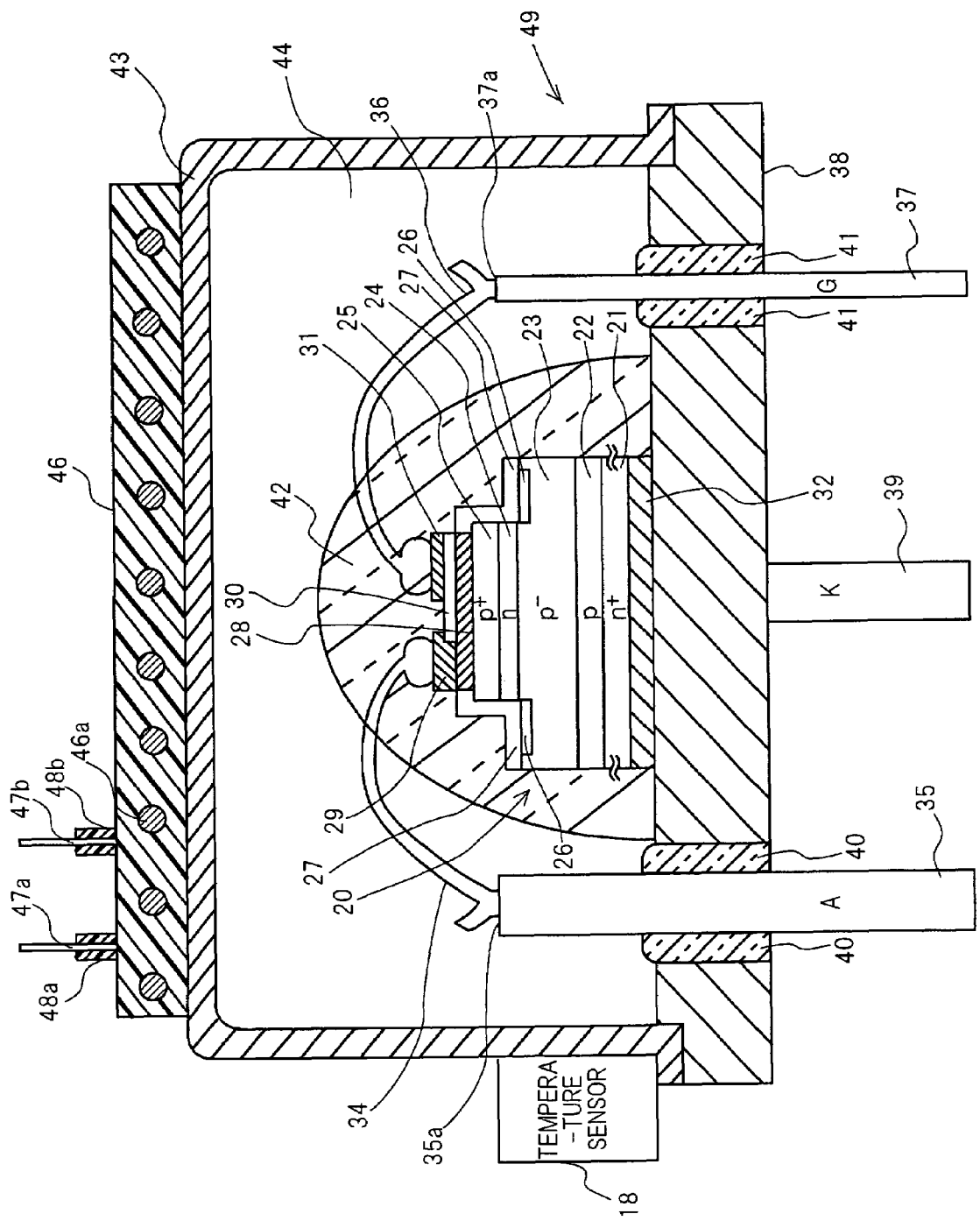
FIG. 2 is a cross-sectional view of a wide-gap GTO thyristor device in accordance with a second embodiment of the present invention.
Figure 3:
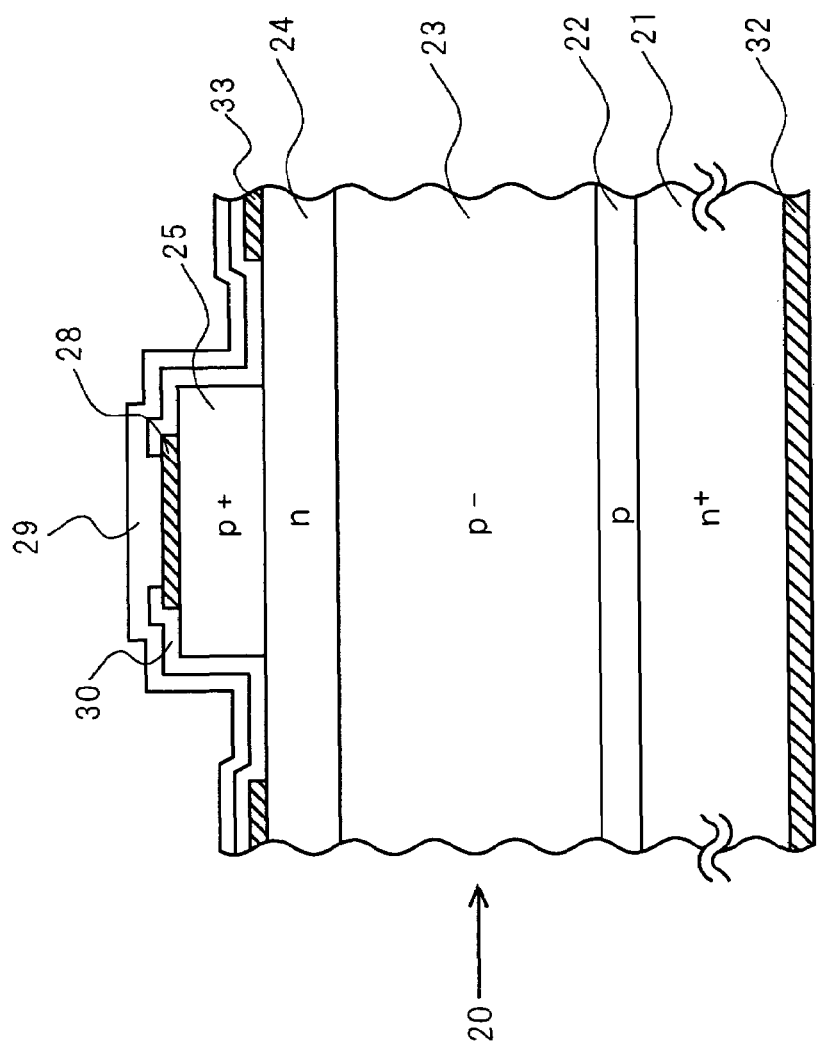
FIG. 3 is a cross-sectional view of a GTO thyristor element for use in the wide-gap GTO thyristor device in accordance with the second embodiment of the present invention, sectioned in a plane perpendicular to the paper face of FIG. 2.

A semiconductor device in accordance with a second embodiment of the present invention is a SiC-GTO thyristor (Gate Turn-Off Thyristor) device 49 having a withstand voltage of 5 kV, and FIG. 2 is a cross-sectional view thereof. FIG. 3 is a cross-sectional view of a cell obtained when the GTO thyristor device 20 shown in FIG. 2 is sectioned in a plane perpendicular to the face of the paper. In an actual element, a multiplicity of the cells, each shown in FIG. 3, are connected in a left-right direction of the figure. In addition, in FIG. 2, a multiplicity of the cells, each shown in FIG. 3, are connected in a direction perpendicular to the paper face of the figure. In FIG. 2 and FIG. 3, a buffer layer 22 of p-type SiC having a thickness of approximately 3 µm is provided on the upper face of a cathode region 21 of n-type SiC having high impurity concentration and a thickness of approximately 320 µm. A cathode electrode 32 is provided on the lower face of the cathode region 21. A p-type SiC base layer 23 having low impurity concentration and a thickness of approximately 60 µm is provided on the buffer layer 22. In the central portion of the base layer 23, an n-type SiC base region 24 and a p-type SiC anode region 25, each having a thickness of approximately 2 µm, are formed sequentially. An n-type SiC field relaxation region 26 is formed around the base region 24. On the surface of the GTO thyristor element 20 configured as described above, a surface protection film 27 having three-layer structure comprising a silicon dioxide layer, a silicon nitride layer and a silicon dioxide layer is formed. On the anode region 25, an anode electrode 28 is formed. On the left region on this anode electrode 28, a second-layer anode electrode 29 is formed, and on the right region, a gate electrode 31 is formed via an insulation film 30. As shown in FIG. 3, on the n-type base region 24, a first-layer gate electrode 33 is formed, and the gate electrode 33 is connected to the gate electrode 31 shown in FIG. 2 via a connection portion not shown.

An electron beam having an irradiation energy of approximately 4 MeV is applied to the GTO thyristor 20 having the above-mentioned configuration at an electron density of approximately $7\times10^{12}$/cm$^2$, and annealing is carried out at a temperature of 700° C. for eight hours. The GTO thyristor element 20 having been subjected to this processing is soldered to the upper face of a support 38 using gold-silicon high-temperature solder. Lead wires 34 and 36 are gold wires having a diameter of 80 µm and connect between the anode electrode 29 and the end 35a of an anode terminal 35 and between the gate terminal 31 and the end 37a of a gate terminal 37, respectively using a lead bonding apparatus. In FIG. 2, the lead wires 34 and 36 are shown only one in number for each; however, in reality, a multiplicity of the respective wires 34 and 36 are connected in parallel. The cathode electrode 32 is attached to the support 38 made of metal and having a cathode terminal 39. The lead wires 34 and 36, the anode terminal 35, the gate terminal 37 and the cathode terminal 39 are electrical connection means. The anode terminal 35 and the gate terminal 37 are passed through the support 38 and firmly fixed while being insulated with high melting point insulating glass portions 40 and 41, respectively from the support 38.

A coating 42 of a synthetic polymer compound having high heat resistance is applied so as to cover the entire face of the GTO thyristor element 20 and the vicinities of the connection portions of the lead wires 34 and 36 to the GTO thyristor element 20. Finally, a metal cap 43 is mounted and welded to the support 38 in the atmosphere of nitrogen gas, consequently, the SiC-GTO thyristor device 49 which is filled with nitrogen gas in the space 44 is completed. A temperature sensor 18 is provided on the side face of the metal cap 43.

A heater 46 serving as a heating means and comprising a nichrome wire 46a embedded in heat-resistant rubber is bonded on the outer upper face of the metal cap 43. The cap 43 can be heated by passing a DC or AC current through the heater 46 using terminals 47a and 47b coated with insulators 48a and 48b, respectively. The heater 46 is a means for raising the temperature of the GTO thyristor element 20 and heats the cap 43 to raise the temperature of the GTO thyristor element 20. Although a temperature controller and a power source similar to the temperature controller 140 and the power source 141 in accordance with the first embodiment shown in FIG. 1 are also included in this embodiment, they are omitted from illustration in FIG. 2.

When the SiC-GTO thyristor device 49 in accordance with this embodiment is operated, a current is passed through the heater 46 to heat the metal cap 43, consequently the temperature of the GTO thyristor element 20 is raised to approximately 200° C. The method of detecting the temperature of the GTO thyristor element 20 is similar to that in the above-mentioned first embodiment. After the temperature of the GTO thyristor element 20 has reached approximately 200° C., a voltage of 5 kV is applied so that the potential of the anode terminal 35 is higher than that of the cathode terminal 39. When the potential of the gate terminal 37 was made equal to that of the anode terminal 35, the SiC-GTO thyristor device 49 was maintained in the OFF state wherein no current flows, and a withstand voltage of 5 kV was obtained.

Subsequently, in this OFF state, the potential of the gate terminal 37 is made lower than the potential of the anode terminal 35, and a gate current is passed from the anode terminal 35 to the gate terminal 37. As a result, the SiC-GTO thyristor device 49 turns to ON state, and a current is passed across the anode terminal 35 and the cathode terminal 39. When the potential of the gate terminal 37 is made higher than the potential of the anode terminal 35 in the ON state, the current flowing through the anode terminal 35 and the cathode terminal 39 is shifted to flow between the gate terminal 37 and the cathode terminal 39. As a result, the current flowing through the anode terminal 35 and the cathode terminal 39 is interrupted, and the SiC-GTO thyristor device 49 turns to OFF state. The voltage across the anode terminal 35 and the cathode terminal 39 at this time is a reverse voltage.

More specifically, when a negative voltage is applied to the cathode terminal 39 and when a voltage equal to or higher than the built-in voltage with reference to the potential of the anode terminal 35 is applied to the gate terminal 37, the SiC-GTO thyristor device 49 turns ON. At this time, electrons are injected into the drift layer 23 from the cathode region 22, whereby conductivity modulation occurs, and the ON resistance decreases significantly. In the ON state of the SiC-GTO thyristor device 49, when the potential of the gate terminal 37 is made higher than the potential of the anode terminal 35, part or whole of the current flowing through the anode terminal 35 and the cathode terminal 39 is extracted from the gate terminal 37, consequently, the GTO thyristor can be made to OFF state.

In the SiC-GTO thyristor device 49 in accordance with this embodiment, the leak current density at a reverse voltage of 5 kV is $5 \times 10^{-3}$ A/cm$^2$ or less in a high temperature atmosphere of 200° C.; hence, the reverse voltage characteristic was excellent.

In the SiC-GTO thyristor device 49 in accordance with this embodiment, it was possible to attain a controllable current of 150 A at a high current density of 300 A/cm$^2$, at which it was difficult to energize a conventional Si semiconductor device having a high withstand voltage of 3 kV or more. When a current of 150 A was passed through the GTO thyristor element 20 at a high current density of 300 A/cm$^2$ and a cyclic frequency of 2 kHz while the temperature thereof was kept at 170° C., the ON voltage was 3.4 V. When a current of 150 A was switched, the turn ON time was 0.4 µs, the turn OFF time was 1.4 µs, the steady loss was 255 W, and the switching loss was 103 W. When the above-mentioned operation was carried out, the junction temperature of the GTO thyristor element 20 became approximately 308° C. in a very short time.

In the case of a conventional Si-GTO thyristor having a withstand voltage of 5.0 kV, the ON voltage is 5.3 V, the turn ON time is 8 µs and the turn OFF time is 22 µs, when a current of 100 A (having a current density of approximately 60 A/cm$^2$) is passed at a temperature of 125° C. When the SiC-GTO thyristor device 49 in accordance with this embodiment is compared with this Si-GTO thyristor device, the ON voltage of the SiC-GTO thyristor device 49 in accordance with this embodiment is lower by approximately 1 V, and the steady loss is approximately 96% of that of the Si-GTO thyristor. The turn ON time and the turn OFF time of the SiC-GTO thyristor device 49 are short, that is, approximately 1/20 and approximately 1/16, respectively, of those of the Si-GTO thyristor. Hence, the switching loss of the SiC-GTO thyristor device 49 is approximately 1/18 or less of that of the Si-GTO thyristor. The total loss of the SiC-GTO thyristor device 49 is approximately 17% of the total loss of the Si-GTO thyristor; consequently, a significant reduction was attained.

The ON resistance of the SiC-GTO thyristor device 49 at a junction temperature of 308° C. is smaller than the ON resistance of the Si-GTO thyristor device at a junction temperature of 125° C. Therefore, the total loss of the SiC-GTO thyristor device 49 is smaller than that of the Si-GTO thyristor device. Furthermore, an energy gap of approximately 1.75 eV larger than the energy gap of Si remains until SiC loses the property of a semiconductor, as it were, until it becomes the state of metal. Also in this point, high reliability with respect to temperature can be ensured. The thickness of the p-type SiC base layer 23 having low impurity concentration is approximately 60 µm. Since the thickness of the depletion layer of the base layer 23 at a reverse voltage of 5 kV is approximately 50 µm, a sufficient margin of approximately 10 µm is provided. With this margin, high reliability with respect to the above-mentioned withstand voltage can be ensured.

In this embodiment, the SiC-GTO thyristor element 20 is heated by the heater 46, and its temperature is maintained at a high temperature of 200° C., and then the SiC-GTO thyristor device 49 is operated, whereby the influence of stacking faults is reduced extremely. As a result, the ON voltage does not rise during the operation, and high reliability can be ensured. As mentioned above, according to the present embodiment, it was possible to attain the SiC-GTO thyristor device 49 being large in controllable current of 150 A, low in loss and high in reliability.

Third Embodiment

Figure 4:
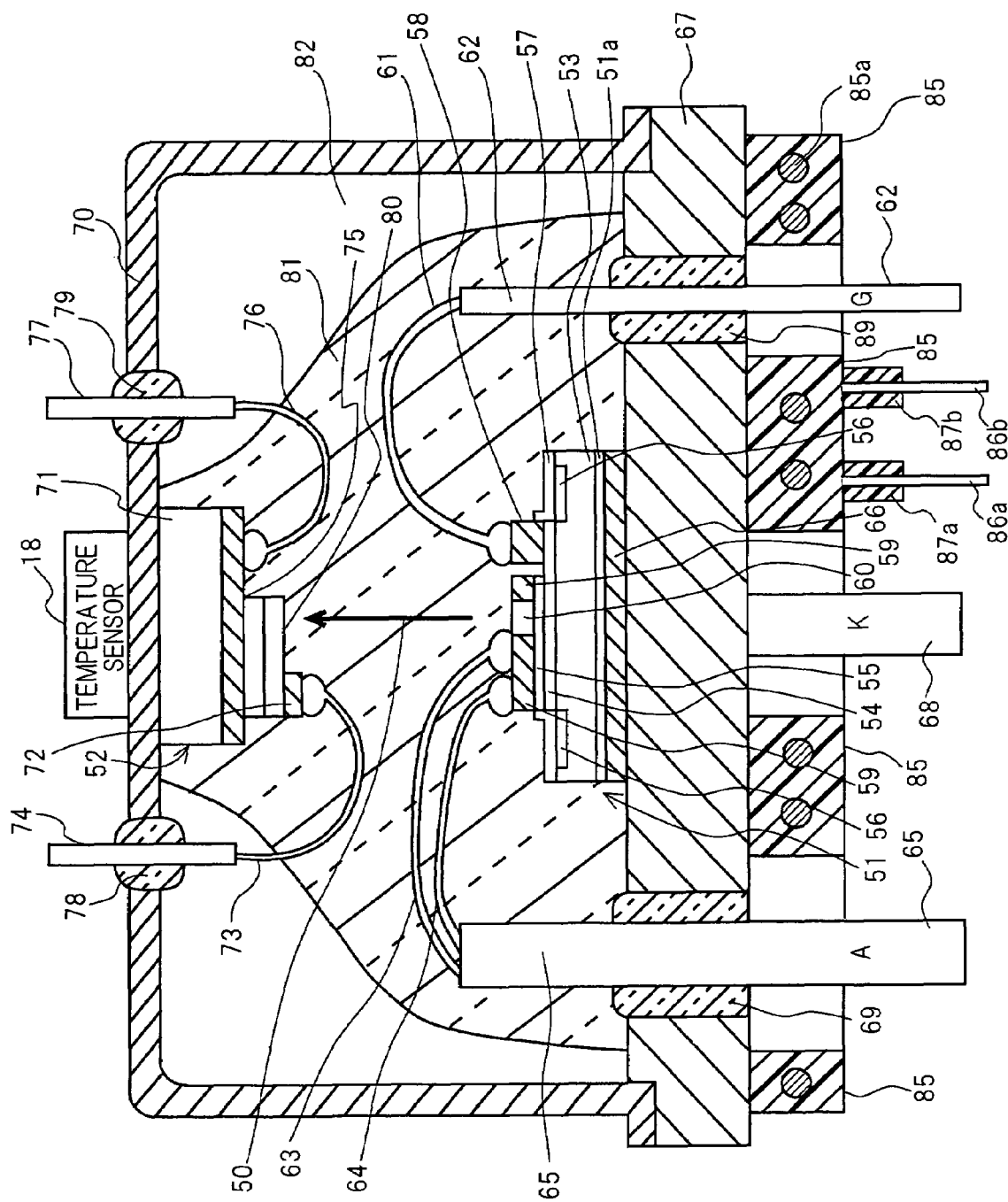
FIG. 4 is a cross-sectional view of an optically-coupled wide-gap semiconductor device in accordance with a third embodiment of the present invention.

A semiconductor device in accordance with a third embodiment of the present invention is an optically-coupled wide-gap power semiconductor device, and FIG. 4 is a cross-sectional view thereof. In the figure, a GaN (gallium nitride)-GTO thyristor element 51 having a withstand voltage of 3 kV and a current capacity of 160 A is used as a main power semiconductor element having a light emission function. A SiC photodiode 52 is used as a light-receiving element. The SiC photodiode 52 is provided so as to be opposed to the GaN-GTO thyristor element 51 inside the same package.

In the GaN-GTO thyristor element 51 shown in FIG. 4, a p-type GaN p-base region 53 having low impurity concentration and a thickness of approximately 35 μm is formed on the upper face of an n-type GaN cathode region 51a having high impurity concentration and a thickness of approximately 250 μm. An n-type GaN n-base region 54 having high impurity concentration and a thickness of approximately 1.7 μm is formed in the central region of the p-base region 53. A cathode electrode 66 is provided on the lower face of the cathode region 52. An n-type SiC field relaxation region 56 is formed inside the p-base region 53 around the n-base region 54. A gate electrode 58 made of metal is provided in the right end portion of the n-base region 54. An n-type SiC anode region 55 having a thickness of 3 μm is provided on the n-base region 54 excluding the portion of the gate electrode 58. An anode electrode 59 of metal having a light emission window 60 is provided on the anode region 55. A surface protection film 57 having a two-layer structure comprising a silicon nitride layer and a silicon dioxide layer is formed on the p-base region 53 and the field relaxation region 56.

The gate electrode 58 is connected to a gate terminal 62 by a gold lead wire 61. The anode electrode 59 is connected to an anode terminal 65 by gold lead wires 63 and 64. The cathode electrode 66 is mounted on a support 67 of metal having a cathode terminal 68. The lead wires 61, 63 and 64, the anode terminal 65, the gate terminal 62 and the cathode terminal 68 are electrical connection means. As the lead wires 61, 63 and 64, a multiplicity of the respective wires connected in parallel should be used depending on the values of currents flowing therethrough.

The SiC photodiode 52 has the same configuration as that of a conventional photodiode except that SiC is used, therefore its detailed description is omitted. The SiC photodiode 52 is bonded to the inner face of a cap 70 via an insulation plate 71 made of aluminum nitride or the like so that its light-receiving portion 80 opposes to the light emission window 60 of the GaN-GTO thyristor element 51. The anode electrode 72 of the SiC photodiode 52 is connected to an anode terminal 74 by a gold lead wire 73. A cathode electrode 75 is connected to a cathode terminal 77 by a gold lead wire 76. The lead wires 73 and 76, the anode terminal 74 and the cathode terminal 77 are electrical connection means, and these are connected to respective external wires. The anode terminal 74 and the cathode terminal 77 are firmly secured in the through holes of the cap 70 via high melting point insulating glass portions 78 and 79. A coating 81 made of a transparent synthetic polymer compound is provided so that the GaN-GTO thyristor element 51, the SiC photodiode 52, the lead wires 61, 63, 64, 73 and 76 and the end of the base terminal 62 and the end of the emitter terminal 65 are covered. On the lower face of the support 67, a heater 85 having a nichrome wire 85a is provided.

The heater 85 is a heating means for raising the temperature of the optically-coupled wide-gap power semiconductor device in accordance with this embodiment. The heater 85 has two terminals 86a and 86b, and a current is passed through the nichrome wire 85a via the two terminals 86a and 86b to heat the heater 85. A temperature sensor 18 is provided on the outer face of the cap 70. Although a temperature controller and a power source similar to the temperature controller 140 and the power source in accordance with the first embodiment shown in FIG. 1 are also used in this embodiment, they are omitted from illustration in FIG. 4.

An example of a method of producing the optically-coupled wide-gap power semiconductor device in accordance with the third embodiment will be described below. The GaN-GTO thyristor element 51 produced in advance is soldered to a predetermined position on the support 67 using gold-silicon high melting point solder. The anode electrode 59 is connected to the anode terminal 65 by the gold lead wires 63 and 64 having a diameter of 80 μm by using a lead bonding apparatus. The gate electrode 58 is connected to the gate terminal 62 by the gold lead wire 61. The material of the synthetic polymer compound 81 before being cured is thickly applied so as to cover the GaN-GTO thyristor element 51.

The SiC photodiode 52 produced in advance is soldered to the inner face of the metal cap 70 via the insulation plate 71 made of aluminum nitride using gold-silicon high melting point solder. Subsequently, the anode electrode 72 is connected to the anode terminal 74 by the gold lead wire 73 having a diameter of 80 μm using a lead bonding apparatus. In addition, the cathode electrode 75 is connected to the cathode terminal 77 by the gold lead wire 76. Next, the material of the synthetic polymer compound 81 before being cured is thickly applied so as to cover the SiC photodiode 52 and the vicinities of the connection portions of the lead wires 73 and 76 to the SiC photodiode 52. In the end, the metal cap 70 and the support 67 are assembled so that the light-receiving portion 80 of the SiC photodiode 52 is opposed to the light emission window 60 of the GaN-GTO thyristor element 51 and the materials of the synthetic polymer compounds with which the two are covered make contact with each other, and then they are welded in an atmosphere of nitrogen. Then, heating is carried out for seven hours at a temperature of 200° C., thereby the synthetic polymer compounds are cured in a state of having a certain degree of flexibility.

An example of operation of the optically-coupled wide-gap power semiconductor device in accordance with the third embodiment will be described below. First, the heater 85 is energized to heat the support 67, and the temperature of the GaN-GTO thyristor element 51 inside the package is raised to approximately 200° C. The method of measuring the temperature of the GTO thyristor element 51 is the same as that of the above-mentioned first embodiment. The potential of the cathode terminal 68 is made lower than the potential of the anode terminal 65, whereby a forward-bias state is obtained. Then, when the potential of the gate terminal 62 is made equal to the potential of the anode terminal 65, the OFF state wherein no current flows is maintained. The withstand voltage is 3 kv and a high withstand voltage is realized. The Sic photodiode 52 is set to a reverse-biased state by means that the potential of the anode terminal 74 is made lower than the potential of the cathode terminal 77.

ON/OFF driving is carried out as follows. The potential of the gate terminal 62 is made lower than the potential of the anode terminal 65, and a gate current is passed from the anode terminal 65 to the gate terminal 62. Consequently, the GaN-GTO thyristor element 51 turns ON, and light 50 having a wavelength of approximately 390 to 570 nm is emitted. This light 50 is received by the SiC photodiode 52, and a photo-electric current corresponding to the amount of the light flows across the anode terminal 74 and the cathode terminal 77. The current flowing across the anode terminal 74 and the cathode terminal 77 indicates the operation state of the optically-coupled wide-gap power semiconductor device in accordance with this embodiment. This current can be used to control the optically-coupled wide-gap power semiconductor device in accordance with this embodiment.

When the potential of the gate terminal 62 is made higher than the potential of the anode terminal 68 in the ON state of the GaN-GTO thyristor element 51, the current flowing across the cathode terminal 66 and the anode terminal 59 is shut off and light emission stops. Since no light is emitted, photoelectric current is extinguished and the SiC photodiode 52 turns to OFF state.

The withstand voltage of the GaN-GTO thyristor element 51 in accordance with this embodiment is approximately 3.0 kV, and the leak current density thereof at this withstand voltage and at a high temperature of 220° C. is $3\times10^{-4}$ A/cm$^2$ or less, an excellent value. The insulation withstand voltage across the GaN-GTO thyristor element 51 and the SiC photodiode 52 was 5 kV or more, and the leak current density at 5 kV was $1\times10^{-5}$ A/cm$^2$ or less.

The GaN-GTO thyristor element 51 in accordance with this embodiment was heated to 185° C., and a current of 160 A was passed at a high current density of 240 A/cm$^2$ and at a cyclic frequency of 3 kHz. The ON voltage at this time was 3.6 V, the turn ON time was 0.3 μs, the turn OFF time was 0.7 μs, the steady loss was approximately 288 W, and the switching loss was 68 W. The junction temperature of the GaN-GTO thyristor element 51 has reached approximately 410° C. in a short time owing to this energization.

For comparison, in the case of a conventional Si-GTO thyristor having a withstand voltage of 3 kV or more, a current of 160 A cannot be passed at a current density of 240 A/cm$^2$. In the case of the Si-GTO thyristor having a withstand voltage of 3 kV, the ON voltage is 4.5 V, the turn ON time is 6 μs and the turn OFF time is 17 μs at a junction temperature of 125° C. when a current of 120 A (a current density of approximately 45 A/cm$^2$) is passed.

When the GaN-GTO thyristor element 51 in accordance with this embodiment is compared with the conventional Si-GTO thyristor, the controllable current of the GaN-GTO thyristor element 51 is 160 A, and is larger than the controllable current of 120 A in the Si-GTO thyristor. The ON voltage of the GaN-GTO thyristor element 51 at a controllable current of 160 A is approximately 80% of the ON voltage of the Si-GTO thyristor at a controllable current of 120 A, and the steady loss is approximately 80%. The turned ON time and the turn OFF time of the GaN-GTO thyristor element 51 are significantly short, approximately $\frac{1}{20}$ and $\frac{1}{24}$ of those of the Si-GTO thyristor, respectively. As a result, it was possible to make the switching loss of the GaN-GTO thyristor element 51 small, $\frac{1}{22}$ or less of that of the Si-GTO thyristor, whereby it was possible to significantly reduce the total loss to approximately 19%. Although the optically-coupled wide-gap power semiconductor device in accordance with this embodiment was energized and operated continuously for 500 hours in an atmosphere of air at 185° C., the optical transfer efficiency was not lowered after the operation. In addition, the optically-coupled wide-gap power semiconductor device was disassembled and examined, and cracks, white turbidity and deformation did not occur in the protection film 81 made of a synthetic polymer compound. Furthermore, the changes of the values in the forward voltage, the leak current density at 3 kV and the switching time were within the ranges of measurement errors. The characteristics of the SiC photodiode also had no change either.

In the case of the GaN-GTO thyristor, the ON resistance at a junction temperature of 410° C. is smaller than the ON resistance of the Si-GTO thyristor at a junction temperature of 125° C.; as a result, the total loss is also smaller. In addition, an energy gap of approximately 1.7 eV remains until GaN loses the property of a semiconductor, as it were, until it becomes the state of metal. Hence, high reliability can be ensured at a high temperature of 400° C. or more. Furthermore, since GaN has a high dielectric breakdown field strength, approximately 1.5 times that of SiC, the p-type GaN base region 53 having low impurity concentration and a thickness of 35 μm and functioning as a drift layer has a value with a sufficient margin for the depletion layer at a withstand voltage of 3 kV; in this point, high reliability with respect to the withstand voltage can be ensured.

In this embodiment, the GaN-GTO thyristor element 51 is heated to 185° C. in advance by the heater 85 and then starts on operation. Therefore, the influence of stacking faults is hardly found, the ON voltage does not rise during the operation, whereby high reliability can be ensured. As described above, in this embodiment, it is possible to realize the optically-coupled semiconductor device being low in loss, large in controllable current and high in reliability.

Fourth Embodiment

Figure 5:
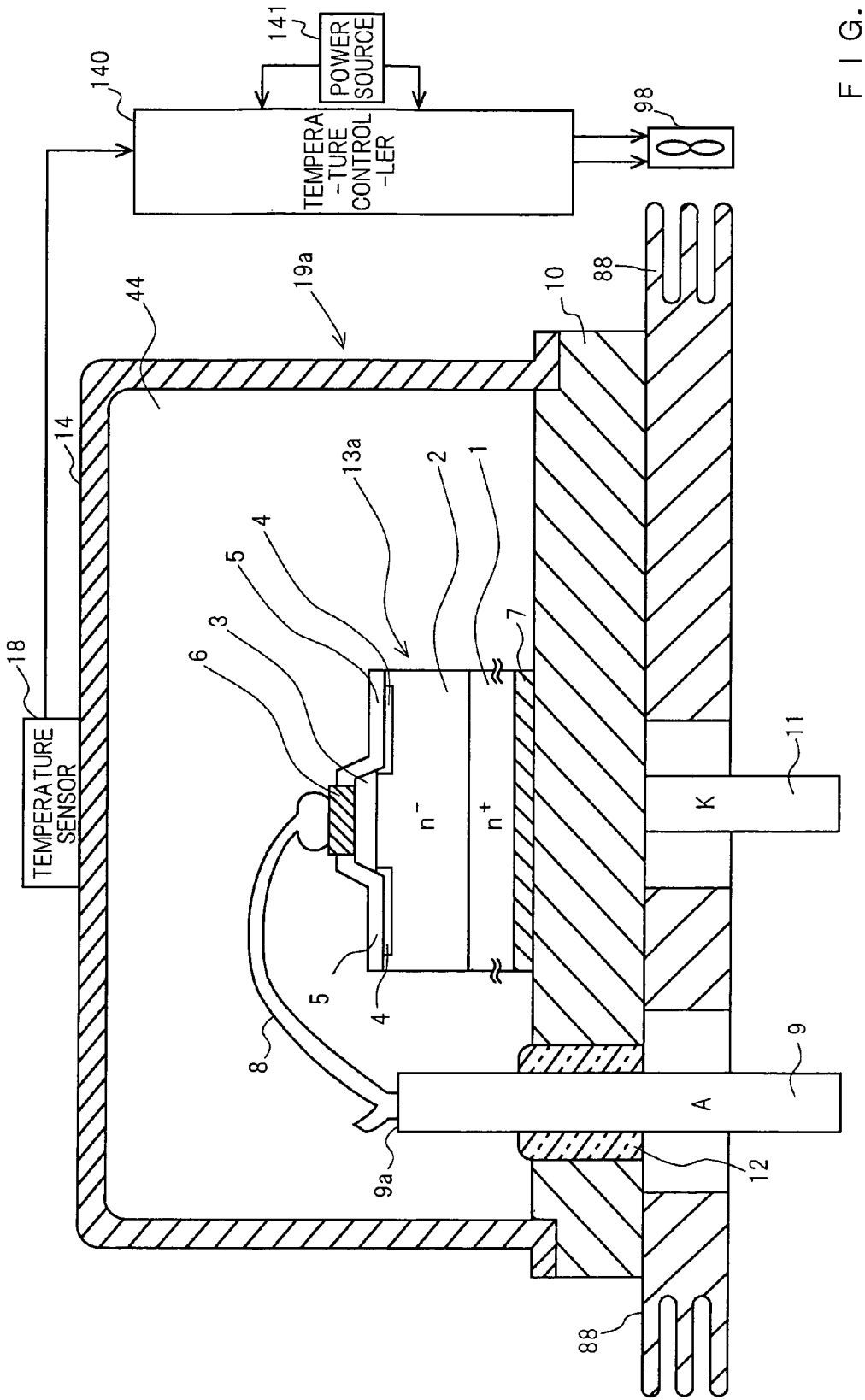
FIG. 5 is a cross-sectional view of a SiC-pn diode device in accordance with a fourth embodiment of the present invention.

A semiconductor device in accordance with a fourth embodiment of the present invention will be described referring to FIG. 5. The semiconductor device in accordance with the fourth embodiment is a SiC-pn diode device 19a and provided with a heat sink 88 instead of the heater 15 in the SiC-pn diode device 19 in accordance with the above-mentioned first embodiment shown in FIG. 1. Since the other components are substantially the same as those of the above-mentioned first embodiment, only different portions are described, and overlapping descriptions are omitted.

The SiC-pn diode device 19a in accordance with the fourth embodiment has a four-layer hexagonal shaped SiC-pn diode element 13a having a withstand voltage of 7 kV. The pn diode element 13a is the same as the pn diode element 13 in accordance with the above-mentioned first embodiment, except that the thickness of the drift layer 2 of the n-type SiC having low impurity concentration is approximately 80 μm (approximately 95 μm in the first embodiment).

The SiC-pn diode device 19a in accordance with this embodiment has the heat sink 88 on the lower outer face of a support 10. An air cooling fan 98 is provided in the vicinity of the heat sink 88. A temperature sensor 18 is provided on the upper outer face of the cap 14, and its detection output is input to a temperature controller 140. The temperature controller 140 controls the operation of the fan 98 on the basis of the detection output of the temperature sensor 18.

When a current is passed through the pn diode element 13a, the pn diode element 13a generates heat corresponding to the current. This heat generation is referred to as "self-heating." In this embodiment, the temperature of the pn diode element 13a is raised by the above-mentioned self-heating. Hence, the heat sink 88 being relatively compact and made of aluminum for example is provided. If the heat sink 88 is large and heat is radiated excessively, the temperature of the pn diode element 13a does not rise; for this reason, it is rather desirable that a small sized heat sink 88 is provided in consideration of the balance between the heat generation amount from the pn diode element 13a and the heat radiation amount from the heat sink. When the temperature of the pn diode element 13a exceeds a desired value, the fan 98 is operated on the basis of the detection output of the temperature sensor 18 to forcibly cool the heat sink. The structure of the heat sink 88 should only be set so that the heat resistance between the heat sink 88 and air at the forced cooling is approximately 1° C./W.

The operation of the SiC-pn diode device 19a in accordance with this embodiment will be described below. First, a predetermined DC current is passed through the pn diode element 13a in the forward direction for a predetermined time, whereby stacking faults are formed and the degradation of the drift layer 2 and the anode region 3 owing to the stacking faults is accelerated. The progress of the degradation can be known by the rise of the ON voltage. When the increase of the ON voltage stops, it is found that the degradation has been saturated. In this embodiment, ordinary operation is carried out after the above-mentioned processing is carried out. It is desirable that the processing of accelerating the degradation owing to the above-mentioned stacking faults in advance should also be carried out for the respective semiconductor devices in accordance with the above-mentioned first to third embodiments.

An operation example of the SiC-pn diode device 19a in accordance with this embodiment will be described below.

A current of 200 A at a cyclic frequency of 5 kHz and a current density of 360 A/cm$^2$ is passed through the SiC-pn diode device 19a. At this time, the ON voltage was 2.3 V, and the reverse recovery charge was 10.4 μC. In addition, the steady loss was approximately 260 W, and the switching loss was approximately 31 W. When the fan 98 was driven to send a wind to the heat sink 88 so that the heat resistance between the air and the heat sink 88 was approximately 1° C./W, it was possible to set the junction temperature of the pn diode element 13a at approximately 350° C.

In the case of a conventional Si-pn diode having a withstand voltage of 7.0 kV, the ON voltage was 3.4 V and the reverse recovery charge was approximately 113 μC at the time when a current of 150 A (current density of approximately 50 A/cm$^2$) was passed through at a junction temperature of 125° C. The steady loss of the SiC-pn diode device 19a in accordance with this embodiment is approximately 90% in comparison with the above-mentioned conventional Si-pn diode. Furthermore, since the reverse recovery charge of the pn diode device in accordance with this embodiment is smaller by approximately one order of magnitude, the switching loss thereof also becomes smaller by approximately one order of magnitude. The total loss of the SiC-pn diode device 19a can be reduced significantly to approximately 49% of that of the Si-pn diode. The ON resistance of the SiC-pn diode device 19a at a junction temperature of 350° C. is smaller than the ON resistance of the Si-pn diode at a junction temperature of 125° C.; as a result, the total loss is smaller. Furthermore, the semiconductor maintains an energy gap of approximately 1.64 eV until it loses the property of a semiconductor, as it were, until it becomes the state of metal. Since this energy gap of the SiC, 1.64 eV, is larger than the energy gap of Si, high reliability with respect to temperature can be ensured.

The controllable current of the SiC-pn diode device 19a in accordance with this embodiment was 200 A. Since the thickness of the n-type SiC drift layer 2 is approximately 80 μm, a margin of approximately 10 μm is provided for the thickness of the depletion layer, 70 μm, at the time when a reverse voltage of 7 kV is applied, whereby high reliability with respect to a withstand voltage of 7 kV is obtained.

In this embodiment, the degradation owing to the stacking faults is advanced so as to become saturated, by passing a predetermined current through the pn diode element 13a for a predetermined time in advance. Hence, the degradation does not proceed gradually while the SiC-pn diode device is used, whereby the changes in characteristics with the passage of time are avoided.

Furthermore, until the pn diode element 13a reaches a temperature of 200° C. or more owing to self-heating at the start of the operation, the current to be passed through is made smaller than the rated current. Hence, in the case that the temperature of the pn diode element 13a is not sufficiently high, the rising of the ON voltage owing to the stacking faults and the significant increase of the steady loss caused thereby can be avoided.

According to this embodiment, a heating means, such as a heater, provided for the semiconductor device in accordance with each of the above-mentioned embodiments is not required, whereby the structure is made simple and the semiconductor device can be made compact.

Fifth Embodiment

A fifth embodiment in accordance with the present invention relates to an inverter apparatus, a type of power conversion apparatus, wherein the SiC-pn diode device 19 in accordance with the above-mentioned first embodiment and the SiC-GTO thyristor device 49 in accordance with the above-mentioned second embodiment are used for switching sections. In the inverter apparatus in accordance with this embodiment, it is desirable that one package in which the above-mentioned SiC-pn diode device 19 and SiC-GTO thyristor device 49 are accommodated should be used as a switching section.

Figure 6:
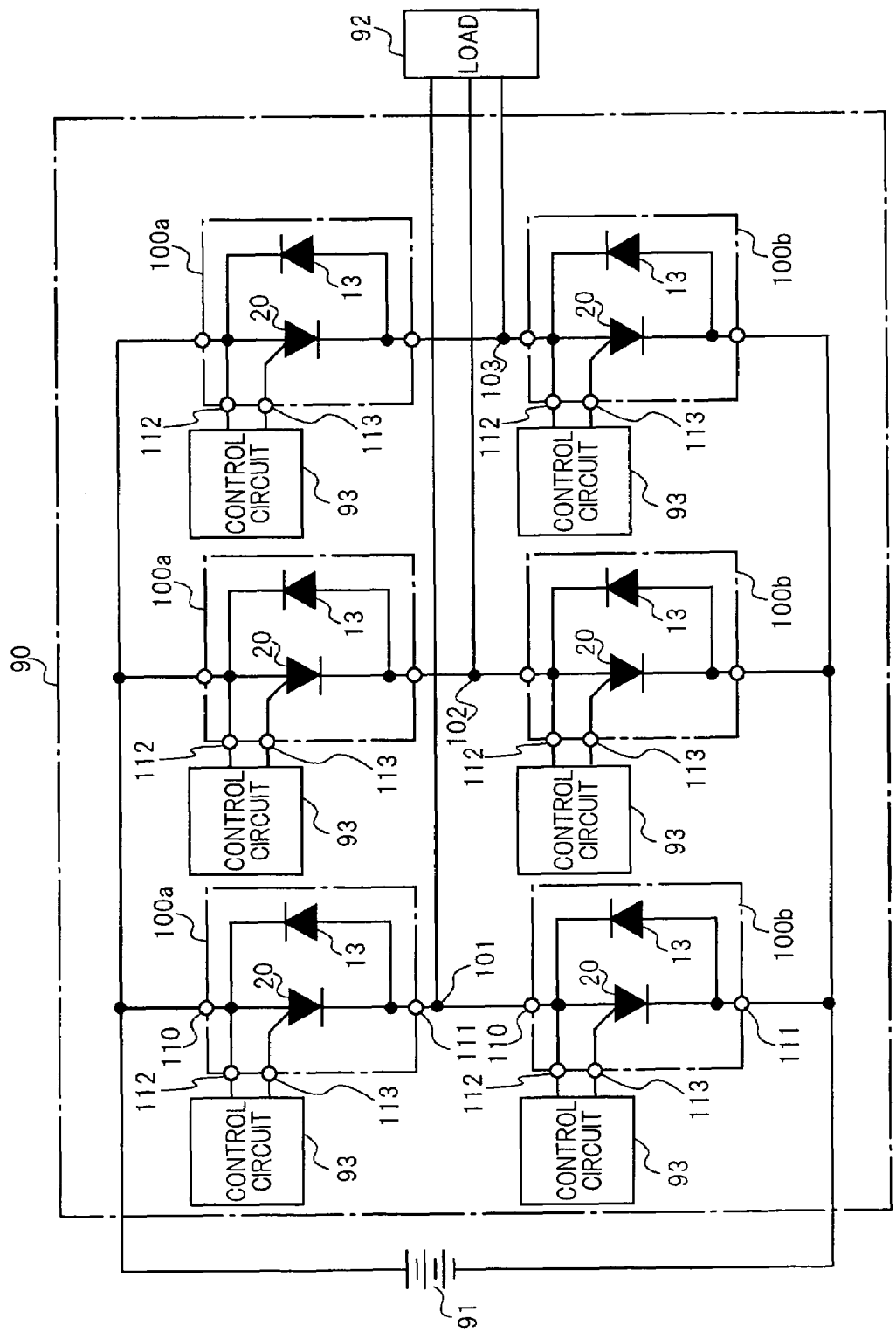
FIG. 6 is a circuit diagram of a three-phase inverter apparatus in accordance with a fifth embodiment of the present invention, configured using the wide-gap semiconductor devices in accordance with the above-mentioned respective embodiments.
Figure 7:
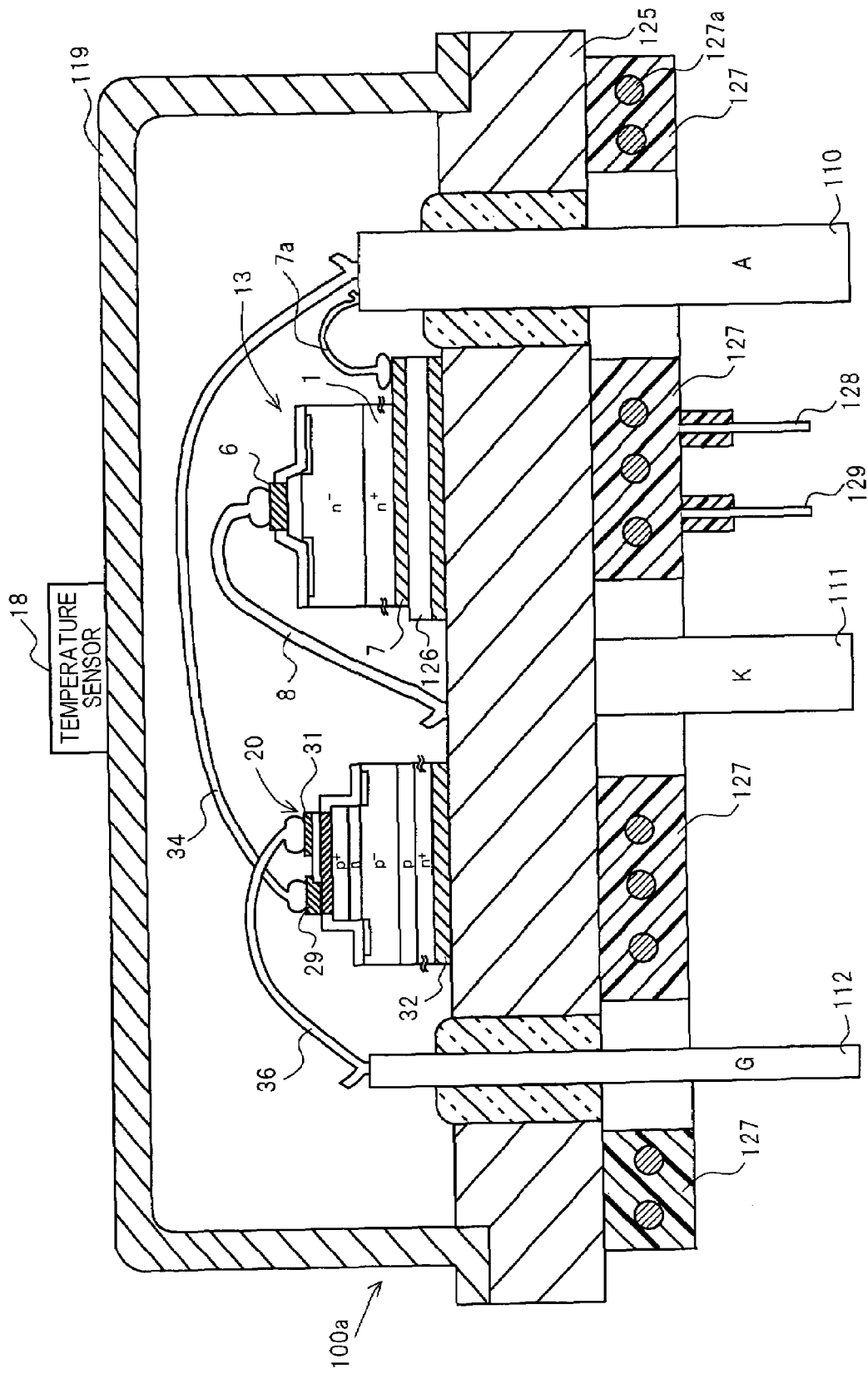
FIG. 7 is a cross-sectional view of a switching module for use in the inverter apparatus in accordance with the fifth embodiment of the present invention.

FIG. 6 is a circuit diagram of the inverter apparatus in accordance with this embodiment. FIG. 7 is a cross-sectional view of a switching module 100a serving as the switching section in which the pn diode element 13 of the above-mentioned SiC-pn diode device 19 and the GTO thyristor element 20 of the above-mentioned SiC-GTO thyristor device 49 are accommodated inside one package.

In FIG. 6, an inverter apparatus 90 is a power conversion apparatus that converts the direct current of a DC power source 91 into a three-phase alternating current and supplies to a load 92. The inverter apparatus 90 is a well-known circuit; three series connections, each comprising two switching modules 100a and 100b connected in series, are connected in parallel between the positive pole and the negative pole of the DC power source 91. The connection points 101, 102 and 103 of the respective three series connections, each comprising the switching modules 101a and 100b, are connected to the load 92. Each of the switching modules 100a and 100b is provided with a control circuit 93, the detailed configuration of which is not shown since it is well known. Each of the control circuits 93 is controlled using a controller omitted from illustration.

Since the switching modules 100a and 100b have the same configuration, the switching module 100a will be described in detail.

In FIG. 7 showing the cross-sectional view of the switching module 100a, the pn diode element 13 shown in FIG. 1 and the GTO thyristor element 20 shown in FIG. 2 are mounted on a support 125 made of metal.

The pn diode element 13 has substantially the same configuration as that shown in FIG. 1; however, the thickness 95 μm of the drift layer 2 shown in FIG. 1, is reduced to 50 μm so as to have a withstand voltage of 5 kV. The pn diode element 13 is mounted via an insulation plate 126 made of aluminum nitride and having a thickness of approximately 500 μm while insulation from the support 125 is maintained. The anode electrode 6 of the pn diode element 13 is connected to the support 125 via a gold lead wire 8. The cathode electrode 7 of the pn diode element 13 is connected to an anode terminal 110 via a lead wire 7a.

The same GTO thyristor element 20 as that shown in FIG. 2 is mounted on the support 125. The cathode electrode 32 of the GTO thyristor element 20 is mounted on the support 125 having a cathode terminal 111 on the lower face thereof. The anode electrode 29 of the GTO thyristor element 20 is connected to the anode terminal 110 via a lead wire 34, and the gate electrode 31 is connected to a gate terminal 112 via a lead wire 36. By the above-mentioned connections, the pn diode element 13 is connected in reverse parallel to the GTO thyristor element 20. On the lower face of the support 125, a heater 127 having a structure similar to that of the heater 85 shown in FIG. 4 is provided. The heater 127 has terminals 128 and 129 for energization. The support 125 is provided with a cap 119 so that the pn diode element 13, the GTO thyristor element 20 and the connection portions of the anode terminal 110 and the gate terminal 112 to the respective lead wires are covered, and the cap is welded to the support 125 in a state that its interior is filled with nitrogen gas. On the outer face of the cap 119, a temperature sensor 18 is provided.

When the inverter apparatus 90 in accordance with this embodiment is operated, a current is passed through the heater 127 in advance before operation to rise the temperatures of all of the switching modules 100*a* and 100*b* to approximately 200° C. The temperature of each of the switching modules 100*a* and 100*b* is detected using the control circuits 93 respectively corresponding thereto by the method described in the above-mentioned first embodiment and controlled so as to be maintained at a predetermined value.

An operation example of the inverter apparatus 90 in accordance with this embodiment will be described below. The temperature of each of the switching modules 100*a* and 100*b* is set at 200° C., the DC voltage of the DC power source 91 is set at 3 kV, and the switching frequency of the switching modules 100*a* and 100*b* is set at 2 kHz, and the inverter 90 is operated. When an AC output current of 150 A was supplied to the load 92 during this operation, the loss caused in each of the switching modules 100*a* and 100*b* was 4.2 W, a relatively low value. The efficiency of the inverter 90 was approximately 98.6%, whereby it was possible to attain a relatively high efficiency. The controllable current of each of the switching modules 100*a* and 100*b* constituting the inverter in accordance with this embodiment was 150 A and the density of the controllable current was 250 A/cm$^2$, whereby large values were obtained. Since each of the switching elements 100*a* and 100*b* is operated at a high temperature of 200° C. or more, the rising of the ON voltage owing to the influence of stacking faults occurred rarely, whereby it was possible to confirm that the increase of the loss owing to the rising of the ON voltage was avoided and that high reliability was obtained.

Although the five embodiments in accordance with the present invention have been described above, the present invention covers many more application ranges or derivative structures.

The semiconductor element may be, for example, a gate turn off thyristor (GTO thyristor), a static induction thyristor, a MOS thyristor, a two-way GTO thyristor, a reverse conduction thyristor and a MOS gate GTO thyristor, provided that the element is a self-excited thyristor capable of being ON/OFF controlled using a gate control signal. The device may also be a composite diode, such as a pn diode having a pn junction and a merged diode.

In addition, a semiconductor element made of SiC or GaN serving as a wide-gap semiconductor material has been described in each of the above-mentioned embodiments; however, the present invention is also applicable effectively to semiconductor elements made of wide-gap other semiconductor materials, such as diamond, gallium phosphide and boron nitride.

Furthermore, the configuration of the present invention is also applicable to each semiconductor element being opposite in polarity, wherein its n-type region is replaced with a p-type region and its p-type region is replaced with an n-type region.

A heater comprising a metallic resistor, such as a nichrome wire, covered with silicone rubber was used as a heater serving as a heating means for raising the temperature of the semiconductor element; however, for example, a plane-shaped heater obtained by subjecting a heating element disposed between two mica or ceramic sheets to forming using a pressure-welding press may also be used. In addition, heaters made of other materials, such as a ceramic heater and a cartridge heater, and radiant heating means, such as an infrared lamp and a far-infrared ceramic heater, may also be used. Furthermore, as other methods, a method of blowing hot air to the semiconductor device using a heat gun or the like and a method of induction heating the metal support 10 and the metal cap 14 of the semiconductor device using a high-frequency induction heating apparatus may also be used. The self-heating of the semiconductor element may also be used instead of the above-mentioned heating means. In this case, in the case of a semiconductor element having three electrodes, either a method of passing a current between the anode electrode and the base electrode or a method of passing a current between the anode electrode and the cathode electrode may be used.

In each of the above-mentioned embodiments, a TO-type package wherein a metal cap is used as the package of the semiconductor device is shown; however, a high heat-resistant resin cap may also be used instead of the metal cap. In addition, as the configuration of each semiconductor device, a mold-type configuration generally used for Si power modules, such as a stud type, a flat type and a SIP type made of a high heat-resistant resin, may also be used, other than the TOM type. As a method of controlling carrier life-time, irradiation of a gamma ray and irradiation of charged particles, such as protons and helium ions, may also be used, other than irradiation of an electron beam. In the above-mentioned embodiments, a three-phase inverter apparatus is taken as an application example; however, other power conversion apparatuses, such as a matrix inverter and a DC-DC converter, may also be used. Furthermore, the present invention is also applicable to other power conversion apparatuses, such as switching power supplies, rectifying apparatuses, regulators and high-frequency generators, other than inverters and converters.

INDUSTRIAL APPLICABILITY

The present invention is intended to realize a semiconductor device being large in controllable current, low in loss and high in reliability even at a high voltage, and is widely applicable to power uses dealing with large currents and high voltages.

The invention claimed is:

1. A semiconductor device comprising:
   a wide-gap bipolar semiconductor element using a wide-gap semiconductor having stacking faults including basal plane dislocation, and having a built-in voltage in the forward direction;
   a semiconductor package accommodating said wide-gap bipolar semiconductor element and having electrical connection means for connecting said wide-gap bipolar semiconductor element to external apparatuses;
   a heater which is provided to the package and heats said wide-gap bipolar semiconductor element inside said semiconductor package to a temperature of 50° C. or more;
   a temperature sensor which is provided to the package and detects the temperature of said wide-gap bipolar semiconductor element; and
   a temperature controller which controls the heater on the basis of a detection output of said temperature sensor so as to heat said wide-gap bipolar semiconductor element to a temperature of 50° C. or more and less than 200° C. before energization of said wide-gap bipolar semiconductor element, and then starts the energization of said wide-gap bipolar semiconductor element, raising the temperature of said wide-gap bipolar semiconductor element to 200° C. or more by self-heating of said wide-gap bipolar semiconductor element.

2. A semiconductor device in accordance with claim 1, wherein said heater is an electric heater.

3. A semiconductor device in accordance with claim 1, wherein said wide-gap bipolar semiconductor element is either a diode having a pn junction or a self-excited thyristor.

4. A semiconductor device in accordance with claim 1, wherein the semiconductor package comprises a support made of metal, on which the wide-gap bipolar semiconductor element is mounted.

5. A semiconductor device in accordance with claim 4, wherein the semiconductor package comprises a cap made of metal fixed on the support so as to cover the wide-gap bipolar semiconductor element.

6. A semiconductor device in accordance with claim 4, wherein the wide-gap bipolar semiconductor element is bonded to a upper face of the support, and the heater is located on a lower face of the support.

7. A semiconductor device in accordance with claim 4, wherein the wide-gap bipolar semiconductor element is mounted via an insulation plate on the support, and the heater is located on a lower face of the support.

8. A semiconductor device in accordance with claim 1, wherein the semiconductor package comprises a molded heat-resistant resin so as to encapsulate the wide-gap bipolar semiconductor element.

9. A semiconductor device comprising:

a wide-gap bipolar semiconductor element using a wide-gap semiconductor having stacking faults including basal plane dislocation, and having a built-in voltage in the forward direction;

a semiconductor package accommodating said wide-gap bipolar semiconductor element and having electrical connection means for connecting said wide-gap bipolar semiconductor element to external apparatuses;

a heat sink which is provided to the package and controls a radiation of heat generated when the said wide-gap bipolar semiconductor element is energized so as to keep said wide-gap bipolar semiconductor element inside said semiconductor package at a temperature 50° C. or more;

a temperature sensor which is provided to the package and detects the temperature of said wide-gap bipolar semiconductor element; and a temperature controller that keeps the temperature of said wide-gap bipolar semiconductor element at the temperature of 50° C. or more and less than 200° C. on the basis of a detection output of said temperature sensor by energizing said wide-gap bipolar semiconductor element with an applied current smaller than a rated current so as to generate self-heating of said wide-gap bipolar semiconductor element under control of a radiation of heat from said wide-gap bipolar semiconductor element by the heat sink, and then allows said wide-gap bipolar semiconductor element to be applied with a current up to the rated current so as to raise the temperature of said wide-gap bipolar semiconductor element to 200° C. or more by self-heating of said wide-gap bipolar semiconductor element.

\* \* \* \* \*